United States Patent
Komaki

(10) Patent No.: US 7,521,349 B2
(45) Date of Patent: Apr. 21, 2009

(54) FUNDAMENTAL CELL, SEMICONDUCTOR INTEGRATED CIRCUIT DEVICE, WIRING METHOD AND WIRING APPARATUS

(75) Inventor: Masaki Komaki, Kasugai (JP)

(73) Assignee: Fujitsu Microelectronics Limited, Tokyo (JP)

( * ) Notice: Subject to any disclaimer, the term of this patent is extended or adjusted under 35 U.S.C. 154(b) by 483 days.

(21) Appl. No.: 10/873,223

(22) Filed: Jun. 23, 2004

(65) Prior Publication Data
US 2004/0222442 A1    Nov. 11, 2004

Related U.S. Application Data

(62) Division of application No. 09/939,752, filed on Aug. 28, 2001, now Pat. No. 6,774,412.

(30) Foreign Application Priority Data

Mar. 30, 2001 (JP) .............................. 2001-100566

(51) Int. Cl.
*H01L 21/44* (2006.01)
(52) U.S. Cl. ............... 438/599; 438/129; 257/E21.705; 257/E21.575
(58) Field of Classification Search ................. 438/599, 438/622, 684, 129; 257/E21.705, E21.575, 257/E21.506
See application file for complete search history.

(56) References Cited

U.S. PATENT DOCUMENTS

| | | | |
|---|---|---|---|
| 4,584,653 A * | 4/1986 | Chih et al. ..................... 716/17 |
| 4,947,229 A | 8/1990 | Tanaka et al. .................. 357/48 |
| 5,117,277 A | 5/1992 | Yuyama et al. ................ 357/71 |
| 5,493,510 A * | 2/1996 | Shikata .......................... 716/9 |
| 5,508,803 A * | 4/1996 | Hibbs et al. ............... 356/243.5 |
| 5,514,895 A * | 5/1996 | Kikushima et al. ........... 257/378 |
| 6,054,872 A | 4/2000 | Fudanuki et al. .............. 326/39 |
| 6,057,225 A | 5/2000 | Yokota ........................ 438/622 |
| 6,093,214 A * | 7/2000 | Dillon ........................... 716/17 |
| 6,121,644 A * | 9/2000 | Tsujihashi et al. ........... 257/207 |
| 6,155,725 A * | 12/2000 | Scepanovic et al. ............ 716/9 |
| 6,501,106 B1 * | 12/2002 | Osajima ...................... 257/202 |
| 6,525,350 B1 * | 2/2003 | Kinoshita et al. ............ 257/202 |

FOREIGN PATENT DOCUMENTS

JP          6-112447          4/1994

* cited by examiner

*Primary Examiner*—Caridad M Everhart
(74) *Attorney, Agent, or Firm*—Arent Fox LLP

(57) ABSTRACT

The present invention provides a fundamental cell, semiconductor integrated circuit device, wiring method and wiring apparatus for designing a layout of a functional circuit block or a semiconductor integrated circuit device using the fundamental cells, with a higher degree of freedom of wirings. The connection terminals 2 and 3 of the fundamental cell 1 are terminals for supplying the power source voltage VDD and ground potential VSS to the N and P type wells. The terminals may be defined as a contact structure between a metal layer and N and P type well areas, and alternatively defined as stacked VIA structure for multilayered metal wiring layers and N and P type well areas if desired in correspondence with the manufacturing process used for manufacturing the semiconductor integrated circuit device implementing the fundamental cell 1. The fundamental cell 1 has neither the connection terminals 2 and 3, nor the power source voltage VDD and ground potential VSS to those two PMOS and NMOS transistors.

9 Claims, 14 Drawing Sheets

FUNDAMENTAL CELL IN ACCORDANCE WITH THE PRESENT INVENTION

: LOWEST METAL WIRING LAYER(M1)

: UPPER METAL WIRING LAYER(M2)

FUNCTIONAL CIRCUIT BLOCK FORMED BY USING FUNDAMENTAL CELLS IN ACCORDANCE WITH THE PRESENT INVENTION

CIRCUIT DIAGRAM OF THE FUNCTIONAL CIRCUIT BLOCK SHOWN IN FIG.2

FIRST PRACTICAL EMBODIMENT OF POWER RAILS WHEN THE FUNDAMENTAL CELLS IN ACCORDANCE WITH THE PRESENT INVENTION ARE ARRANGED IN A FORM OF MATRIX

SECOND PRACTICAL EMBODIMENT OF POWER RAILS WHEN THE FUNDAMENTAL CELLS IN ACCORDANCE WITH THE PRESENT INVENTION ARE ARRANGED IN A FORM OF MATRIX

THIRD PRACTICAL EMBODIMENT OF POWER RAILS WHEN THE FUNDAMENTAL CELLS IN ACCORDANCE WITH THE PRESENT INVENTION ARE ARRANGED IN A FORM OF MATRIX

:UPPER METAL WIRING LAYER(M2)

FOURTH PRACTICAL EMBODIMENT OF POWER RAILS WHEN THE FUNDAMENTAL CELLS IN ACCORDANCE WITH THE PRESENT INVENTION ARE ARRANGED IN A FORM OF MATRIX

▨ :UPPER METAL WIRING LAYER(M2)

▦ :UPPER METAL WIRING LAYER,WHICH IS PLACED UPWARDLY OVER THE UPPER METAL WIRING LAYER M2 (M3)

FIFTH PRACTICAL EMBODIMENT OF POWER RAILS WHEN THE FUNDAMENTAL CELLS IN ACCORDANCE WITH THE PRESENT INVENTION ARE ARRANGED IN A FORM OF MATRIX

:UPPER METAL WIRING LAYER(M2)

SIXTH PRACTICAL EMBODIMENT OF POWER RAILS WHEN THE FUNCTIONAL CIRCUIT BLOCKS IN ACCORDANCE WITH THE PRESENT INVENTION ARE ARRANGED TO FORM A SEMICONDUCTOR INTEGRATED CIRCUIT DEVICE

BLOCK DIAGRAM OF A WIRING APPARATUS IN ACCORDANCE WITH THE PRESENT INVENTION

A FLOW CHART OF A WIRING METHOD FOR WIRING IN A FUNCTIONAL CIRCUIT BLOCK USING THE FUNCTIONAL CIRCUIT BLOCKS IN ACCORDANCE WITH THE PRESENT INVENTION

FUNDAMENTAL CELL IN ACCORDANCE WITH THE RELATED ART

:LOWEST METAL WIRING LAYER(M1)

FUNCTIONAL CIRCUIT BLOCK FORMED BY USING
THE FUNDAMENTAL CELLS OF THE RELATED ART

POWER RAIL EMBODIMENT WHEN FORMING THE FUNDAMENTAL CELLS OF THE RELATED ART IN A FORM OF MATRIX

US 7,521,349 B2

FUNDAMENTAL CELL, SEMICONDUCTOR INTEGRATED CIRCUIT DEVICE, WIRING METHOD AND WIRING APPARATUS

CROSS-REFERENCE TO RELATED APPLICATION

This is a Divisional Application which claims the benefit of U.S. patent application Ser. No. 09/939,752, filed Aug. 28, 2001 now U.S. Pat. No. 6,774,412. The disclosure of the prior application is hereby incorporated herein in its entirety by reference.

BACKGROUND OF THE INVENTION

1. Field of the Invention

The present invention relates to a fundamental cell that constitutes a basic unit in the layout of a semiconductor integrated circuit device, a semiconductor integrated circuit device which uses such fundamental cells, a wiring method as well as a wiring apparatus thereof, and more particularly to a fundamental cell that may be used in a semiconductor integrated circuit device of the gate array type and standard array type, a semiconductor integrated circuit device that uses such fundamental cells, and a wiring method as well as wiring apparatus thereof.

2. Description of the Related Art

A semiconductor integrated circuit device of the gate array type and standard cell type is used so far, in which functional circuit blocks constituted of fundamental cells in a matrix structure are arranged. FIG. 12 shows a typical example of a fundamental cell 100. The fundamental cell 100 has therein a power supply voltage wiring VDD and ground potential wiring VSS, or so-called the power rails VDD and VSS in order to supply the power supply voltage VDD and grand potential VSS respectively to the fundamental cell 100. connection terminals 2 and 3 are used for biasing N-type well region of a PMOS (P-channel metal oxide semiconductor) transistor and P-type well region of an NMOS (N-channel metal oxide semiconductor) transistor to the power supply voltage VDD and the ground potential VSS, respectively.

When the power rails VDD and VSS or the connection terminals 2 and 3 are placed fixedly in the fundamental cell 100, if the fundamental cells 100 are arranged in a matrix (see also FIG. 13 and FIG. 14), the power rails VDD and VSS or the connection terminals 2 and 3 will be placed in a predetermined wiring track. Thus the power rails VDD and VSS have been designed to include the connection terminals 2 and 3 between fundamental cells 100 so as to coincide with the wiring track specification of the fundamental cell 100 in the row direction of the fundamental cells 100 (direction lateral to the fundamental cells 100) in each fundamental cell 100. The power rails VDD and VSS will be made at the same time as the fundamental cells 100 are arranged in a matrix so as to constitute a functional circuit block 200. As shown in FIG. 14, the power rails VDD and VSS will be wired in parallel to the wiring track along with the row direction of the fundamental cells 100 (lateral to the fundamental cells 100) when the fundamental cells 100 are placed. The power rails VDD and VSS are, in general, so important wirings for operating the circuit that the wirings are formed with metal wiring layer M1, the lowest layer.

However, in the fundamental cell 100 in accordance with the Related Art as have been described above, the wirings of the power rails VDD and VSS will be completed at the same time as the fundamental cells 100 are arranged in a matrix so as to form a functional circuit block, however, there will be problems that the wiring direction, width of wirings, the wiring layer of the power rails VDD and VSS cannot be moved or changed from the lowest metal wiring layer M1.

Now referring to FIG. 13, there is shown a layout example of four fundamental cells 100A, 100B, 100C, and 100D in a matrix of 2 by 2 grid to form a functional circuit block 200 as shown by the operating circuit in FIG. 3. As can be appreciated clearly from the figure, the power rails VDD and VSS are formed in the lowest metal wiring layer M1, in a predetermined width of wirings along with the wiring track extending in the row direction from the fundamental cell 100A to the fundamental cell 100D (lateral direction extending from the fundamental cell 100A to the fundamental cell 100D). In other words, the power rails VDD and VSS are wired and formed in the lowest metal wiring layer M1 between the outputs of the fundamental cell 100C forming a NOR1 and the fundamental cell 100D forming a NOR2, and the given gates of the fundamental cells 100A and 100B forming NAND1 having these outputs as input. In the semiconductor integrated circuit devices of the gate array type and standard cell type, in general, upper metal wiring layers are used for wiring between functional circuit blocks, and the signal wirings within a functional block are made by using the lowest metal wiring layer M1 together with the power rails VDD and VSS. The connection between NOR1 and NAND1 and the connection between NOR2 and NAND1 need to bridge over the power rails VDD and VSS formed in the lowest metal wiring layer M1, by routing through the metal wiring layer M2 through VIA 101A and 101C, and through VIA 101B and 101D, respectively. When the functional circuit block is much larger, the wirings need to bridge over the power rails VDD and VSS more often to spoil the degree of freedom of metal wirings and to complicate the structure of metal wirings. In addition, the number of wirings in the upper metal wiring layer M2 will become numerous to narrow the wiring space in the upper metal wiring layer M2. When wiring other signal lines using the same wiring layer, while having the power rails VDD and VSS fixed to fundamental cells 100, the number of wiring tracks is required to increase as much as needed to finally increase the cell height of fundamental cell 100. This may cause another problem of disturbance in the integration of semiconductor integrated circuit device.

Furthermore, as shown in FIG. 14, since the wiring direction, wiring width, and wiring layer of power rails VDD and VSS are fixed, the wiring scheme of power rails VDD and VSS may not be allowed to change so as to conform to the circuit specification of a functional circuit block 300 having fundamental cells 100 (M, N) arranged in a matrix grid (where M and N are integer equal to or more than 1). In other words, there may be cases in which a capability of delivering sufficient power supply for performing desired operation in the functional circuit blocks that operates at a very increased speed or that drives a large load cannot be ensured. In addition, there may be cases in which the wiring pitch is narrower than required to have the potential of delivering power to the loaded functional circuit blocks that consume small current, so that it may interfere higher integration.

In FIG. 14, since the wiring direction, wiring width, and wiring layer of power rails VDD and VSS for fundamental cells 100 (M, N) are fixed, the wiring will be also fixed in the functional circuit block 300 of fundamental cells 100 (M, N) arranged accordingly. When forming a semiconductor integrated circuit device of the gate array type or standard cell type by combining such functional circuit blocks 300, the wiring direction, wiring width, and wiring layer of power rails VDD and VSS in the functional circuit blocks 300 will be inherently fixed. Thus, there may be cases in which functional circuit blocks 300 cannot be arranged so as to conform to the wiring of power rails VDD and VSS around the functional circuit blocks 300, resulting in a problem that a further integration in a semiconductor integrated circuit device of the gate array type and standard cell type will be interfered.

SUMMARY OF THE INVENTION

The present invention has been made in view of the above circumstances and has an object to overcome the above problems and to provide a fundamental cell, a semiconductor integrated circuit device, a wiring method thereof and wiring apparatus, allowing a degree of freedom in wirings when designing a layout of functional circuit blocks or a semiconductor integrated circuit device by making use of the fundamental cells.

To achieve the objects and in accordance with the purpose of the invention, as embodied and broadly described herein, one aspect of a fundamental cell, in accordance with the present invention, for forming a basic unit in the layout of a semiconductor integrated circuit device, comprises:

no fixed wiring for commonly wiring between fundamental cells, and connection terminals to be connected to an upper wiring layers.

In the fundamental cell in accordance with the present invention, no fixed wiring to commonly wire between fundamental cells is incorporated in the fundamental cell, and connecting terminals to connect to other fundamental cells are formed for wiring in an upper wiring layer instead.

In this manner, wiring scheme will not be restricted by the fixed wiring to be wired between fundamental cells, to freely design the wirings. In addition, since no fixed wiring exists the wirings within a functional circuit block may be freely configured or changed in order to avoid the interference between the fixed wiring and other signal wirings on a layout when forming a functional circuit block by arranging fundamental cells. More specifically, in accordance with the present invention, the wiring pattern using the upper layer wirings to bridge over the lower layer wiring may be decreased to the required minimum to ensure the degree of freedom of wiring as much as possible. Therefore, the wiring pattern in accordance with the present invention may achieve a simplest wiring pattern possible, which may not interfere the wiring region in the upper wiring layers.

The wiring to be placed between fundamental cells may be freely configured in the upper wiring layers independent of the wiring within a fundamental cell, so that the requirement of wiring tracks as needed may be ensured while keeping the cell height of the fundamental cell as low as possible when compared with the configuration of both wirings in the same wiring layer. Thus, the present invention may achieve a lower cell height of the fundamental cell together with an efficient wiring scheme to greatly contribute to the higher integration of semiconductor integrated circuit devices. The wiring direction, wiring width and wiring layer of wiring to be placed between fundamental cells may be configured as required by the circuit operation specification of the functional circuit blocks used so that the optimum circuit operation can be attained by the wiring most suitable to the requirement of operation specification of respective circuits. In addition, in the semiconductor integrated circuit device of the gate array type and standard cell type, which need to arrange functional circuit blocks with fundamental cells combined in a matrix structure, the wiring direction, wiring width, and wiring layers of wiring to be placed between fundamental cells may be designed freely in correspondence with the wiring layout made in a functional circuit block, resulting in a wiring layout of functional circuit blocks as effective as possible to realize higher integration of semiconductor integrated circuit devices.

The semiconductor integrated circuit device in one aspect in accordance with the present invention may comprise a fundamental cell, which constitutes a basic unit in the layout design, having no fixed wiring to be placed in common between the basic units, and having connecting terminals to be connected to upper wiring layers, and upper layer wirings of a predetermined wiring direction and a predetermined wiring width appropriately selected for connecting within the upper wiring layer between the connecting terminals of corresponding fundamental cells.

The semiconductor integrated circuit device in accordance with the present invention may be formed by arranging more than two fundamental cells and by connecting the corresponding connecting terminals between the fundamental cells in a predetermined wiring direction and predetermined wiring width preferably selected.

The wiring method in accordance with one aspect of the present invention for wiring a semiconductor integrated circuit device including more than two fundamental cells, which constitutes basic units in the layout design, having no fixed wiring to be placed in common between the basic units, and having connecting terminals to be connected to an upper wiring layers, may comprise the step of wiring upper wirings at first by appropriately selecting the wiring direction and wiring width of upper wiring to be connected within an upper wiring layers between the corresponding connecting terminals of fundamental cells.

The wiring method will wire the upper wiring prior to other wirings by appropriately selecting the wiring direction and wiring width of the upper wirings when connecting the corresponding connecting terminals between fundamental cells in an upper wiring layers.

The wiring method in accordance with another aspect of the present invention for wiring a semiconductor integrated circuit device including more than two fundamental cells, which constitutes basic units in the layout design, having no fixed wiring to be placed in common between the basic units, and having connecting terminals to be connected to upper wiring layers, may comprise the step of wiring the upper wirings in an automatic wiring process together with other wirings.

The wiring method will wire the upper wirings in an automatic wiring process together with other wirings.

In this manner, a semiconductor integrated circuit device will be formed from functional circuit blocks, which allow the internal wiring to be configured and changed as desired by combining the fundamental cells that will not be restricted by the upper wirings to freely draw the wiring pattern and that have upper wirings unfixed, so that the mutual interference between the upper wirings and other signal wirings may be avoided. Then the wiring patterns using the upper layers wiring to bridge over the lower layer wiring may be decreased to the required minimum to ensure the degree of freedom of wiring as much as possible. Therefore, the wiring patterns in accordance with the present invention may achieve a simplest wiring pattern possible, which may not interfere the wiring region in the upper wiring layer. Since the upper wirings may be freely configured as desired in the upper wiring layers independent of the wiring within the fundamental cells, the present invention may provide a semiconductor integrated circuit device, in which the requirement of wiring tracks as needed may be ensured while keeping the cell height of the fundamental cells as low as possible when compared with the configuration of both wirings in the same wiring layer. The wiring direction and wiring width of the upper layer wiring may be configured as required by the circuit operation specification of the functional circuit blocks to be used so that a semiconductor integrated circuit device may be provided to attain the optimum circuit operation by the wiring most suitable to the requirement of operation specification of respective circuits. In addition, the wiring direction, wiring width, and wiring layers of wiring to be placed between fundamental cells may be designed freely as desired in correspondence with the wiring layout made in a functional circuit block, resulting in a wiring layout of functional circuit blocks as effective as possible to realize higher integration of semiconductor integrated circuit devices.

By forming the wiring width of upper layer wirings in a plane beyond the cell height of the fundamental cells, the wiring plane of the power supply voltage or the ground potential may be formed to cover the functional circuit blocks in the semiconductor integrated circuit device for a preferable measure of noise relaxation. In such a case, if more than two upper wiring layers are used then the wiring planes having a multiple plane structure will be formed by designing wiring layers for each different upper layer wiring.

The wiring apparatus in accordance with one aspect of the present invention for achieving the wiring method as have been described above, may comprise:

a cell information storage unit for storing fundamental cell information including the position of connecting terminals;

a wiring information configuration unit for configuring as needed the wiring information with respect to the wiring direction, wiring width, wiring priority, wiring layer of upper layer wirings to connect to corresponding connector terminals of fundamental cells, and a wiring prohibited area in the wiring path;

a wiring information storage unit for storing wiring information configured by the wiring information configuration unit;

a controller unit for performing the wiring process in accordance with the information on the wiring direction, wiring width, wiring priority, and wiring layer stored in the wiring information storage unit and based on the position information of the connector terminals stored in the cell information storage unit for bypassing the wiring prohibited area in the wiring path;

a wiring monitoring unit for monitoring the progress of wiring process performed by the controller unit; and a wiring data storage unit for storing the resulting wiring process performed by the controller unit.

The wiring apparatus as have been described above will store in the wiring information storage unit the wiring information on the wiring direction, wiring width, wiring priority, and wiring layer of the upper layer wirings for connecting appropriately corresponding connector terminals between fundamental cells and information including the wiring prohibited region in the wiring path, determined by the wiring information configuration unit to use together with the fundamental cell information including the position of connector terminals stored in the cell information storage unit to perform the wiring process by the controller unit. The progress of wiring process will be monitored by the wiring monitoring unit and the resulting wiring process will be stored in the wiring data storage unit.

By the wiring apparatus of the present invention, for performing the wiring on a functional circuit block or on a semiconductor integrated circuit device having more than two fundamental cells arranged, the wiring information of the upper layer wirings may be configured and stored to use the fundamental cell information including the position of connector terminals to monitor the wiring process to be performed, thereby allowing performing an optimum wiring process.

The above and further objects and novel features of the invention will more fully appear from following detailed description when the same is read in connection with the accompanying drawings. It is to be expressly understood, however, that the drawings are for the purpose of illustration only and not intended as a definition of the limits of the invention.

BRIEF DESCRIPTION OF THE DRAWINGS

The accompanying drawings, which are incorporated in and constitute a part of this specification illustrate an embodiment of the invention and, together with the description, serve to explain the objects, advantages and principles of the invention.

In the drawings.

DETAILED DESCRIPTION OF THE PREFERRED EMBODIMENTS

A detailed description of some preferred embodiments embodying the fundamental cell, semiconductor integrated circuit device, wiring method, and wiring apparatus in accordance with the present invention will now be given referring to the accompanying drawings.

Figure 1:
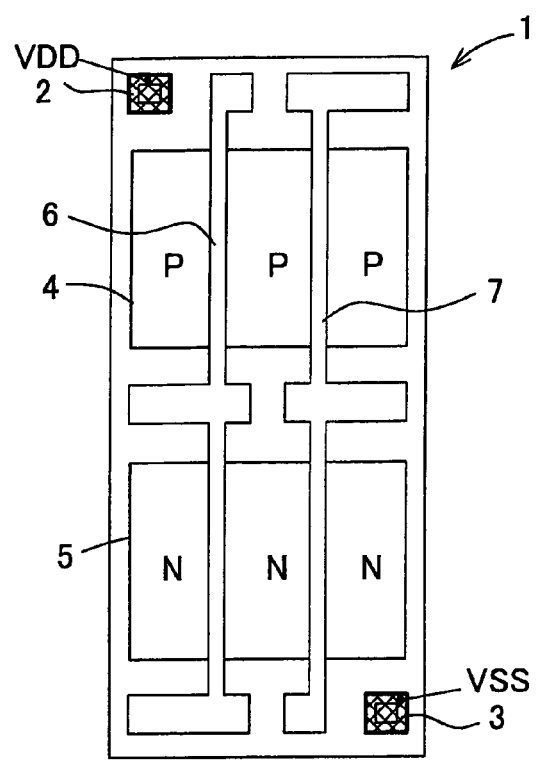
FIG. 1 is a layout diagram illustratively indicative of a fundamental cell in accordance with the present invention.
Figure 1:
Figure 1:
Figure 12:
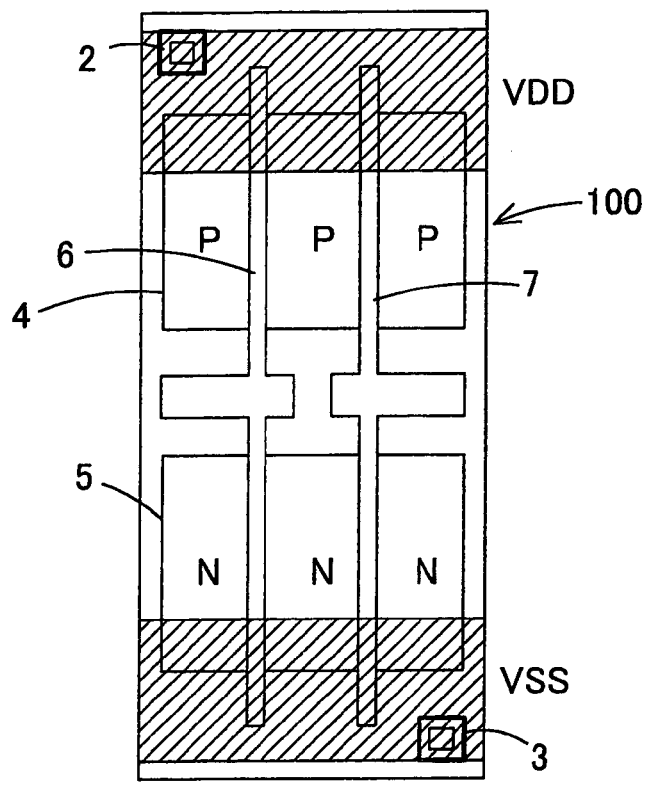
FIG. 12 is a schematic diagram illustratively indicative of a fundamental cell in accordance with the Related Art.
Figure 12:
Figure 13:
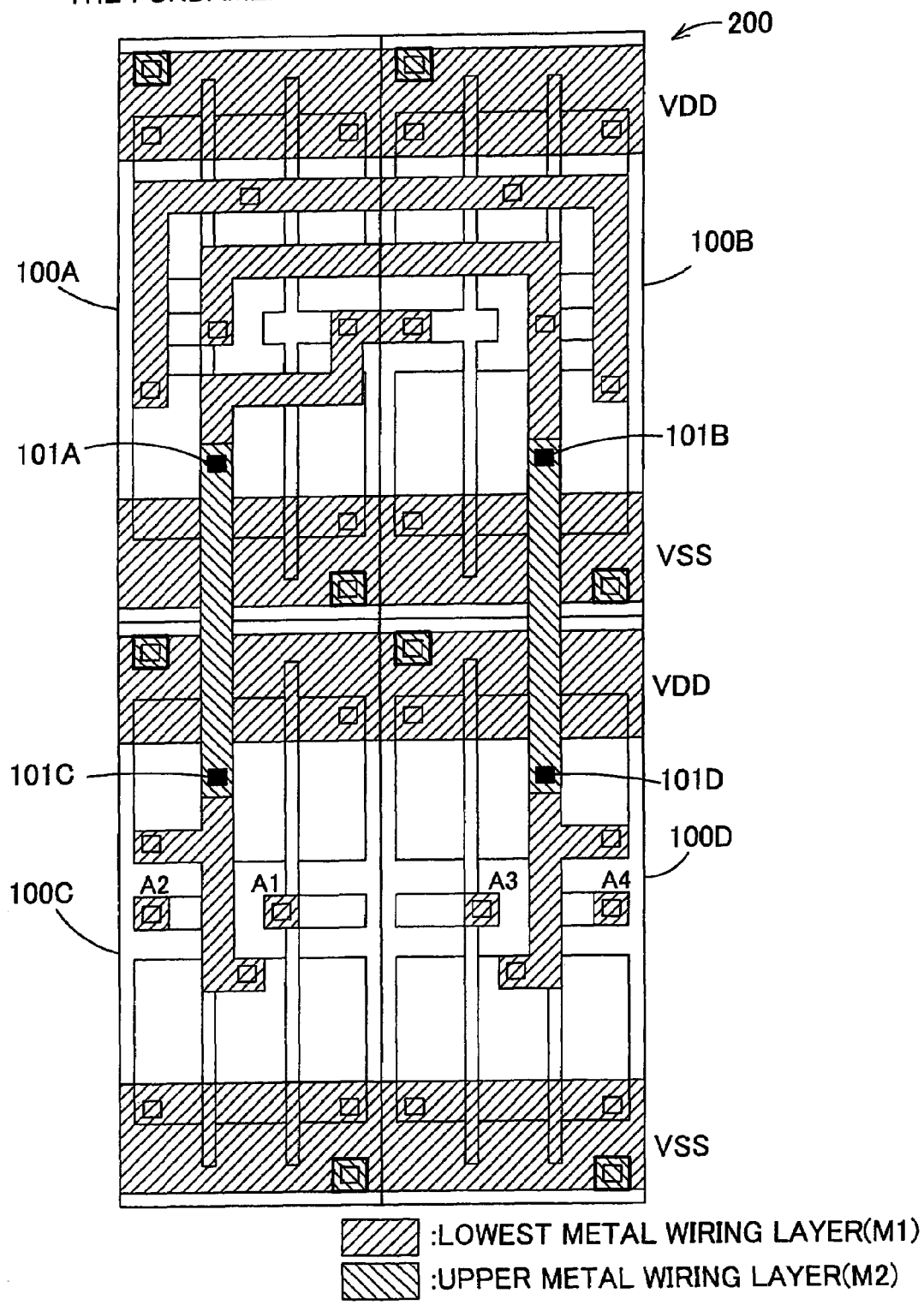
FIG. 13 is a layout diagram illustratively indicative of a functional circuit block formed by using the fundamental cells of the Related art.
Figure 14:
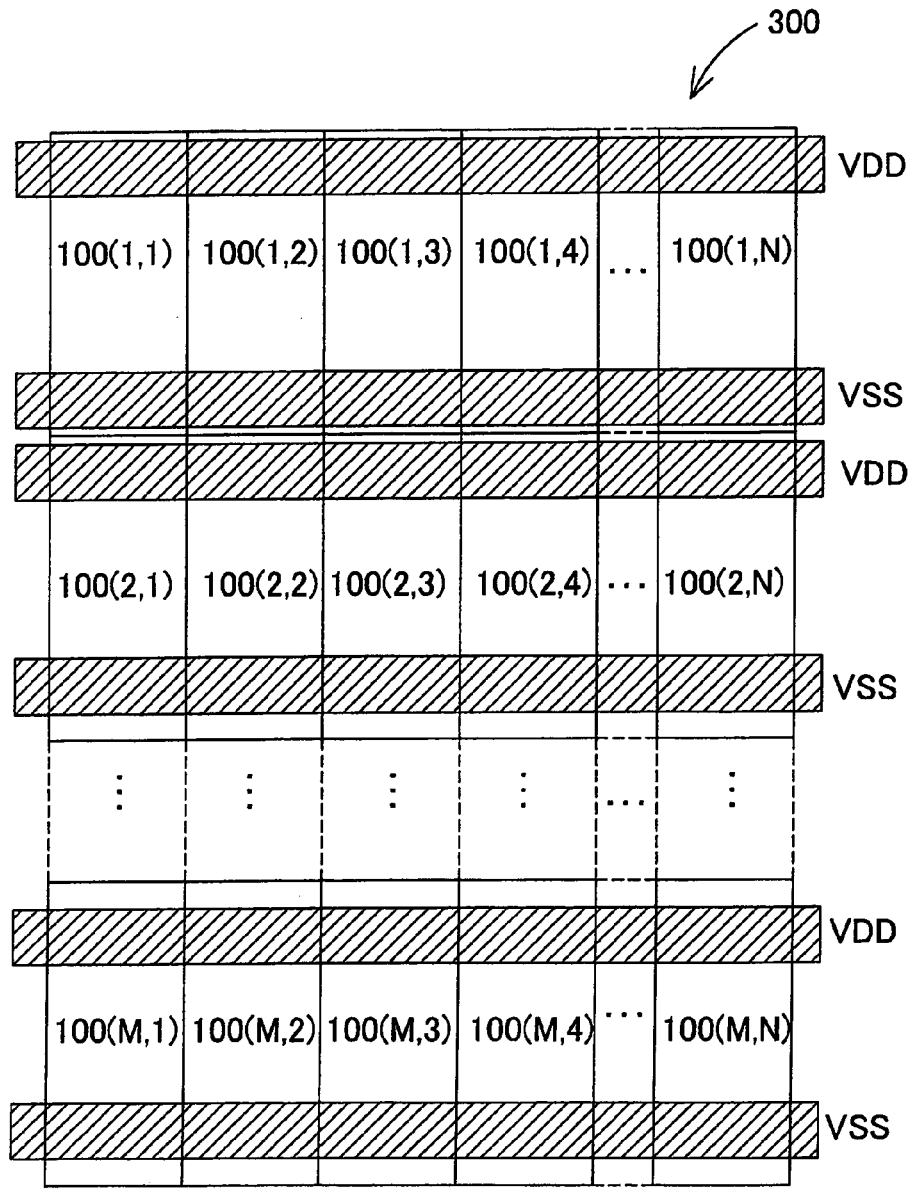
FIG. 14 is a layout diagram illustratively indicative of a power rail embodiment when forming the fundamental cells of the Related art in a form of matrix.

A fundamental cell 1 of one preferred embodiment of the present invention shown in FIG. 1 has a set of P type diffusion region 4 and N type diffusion region 5 divided by two polysilicon gates 6 and 7 in a manner similar to the fundamental cell 100 of the Related art (see FIG. 12) to form a region sandwiched between those two polysilicon gates 6 and 7 used for a common source or a drain region of thus formed two PMOS and NMOS transistors. Those PMOS and NMOS transistors may be formed in the N type well region and P type well region (not shown in the figure), respectively. The connector terminals 2 and 3 may be terminals for supplying the power source voltage VDD and ground potential VSS to the N type well and P type well regions. Those terminals may be formed as a contact structure between the metal wiring layer and N type and P type well regions, in addition, may be formed as a stacked VIA structure between multilayered metal wiring layers and N type and P type well regions as well, depending on the manufacturing process which produces the fundamental cell 1. In the preferred embodiment of the present invention, those connection terminals 2 and 3 and the power rails VDD and VSS for supplying the power supply voltage VDD and ground potential VSS to those two PMOS and NMOS transistors are not implemented yet.

Figure 2:
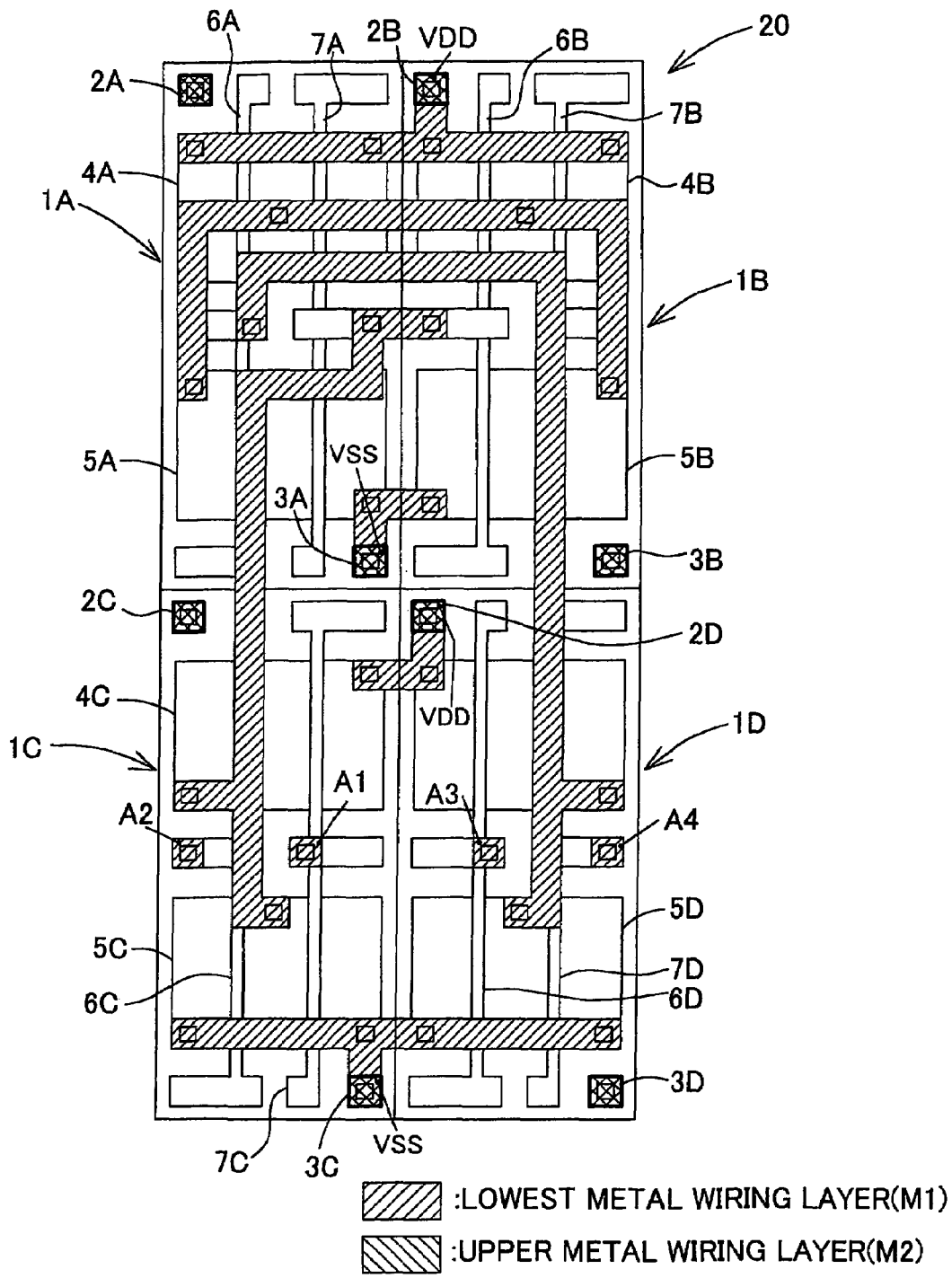
FIG. 2 is a layout diagram illustratively indicative of a functional circuit block formed by using fundamental cells in accordance with the present invention.
Figure 3:
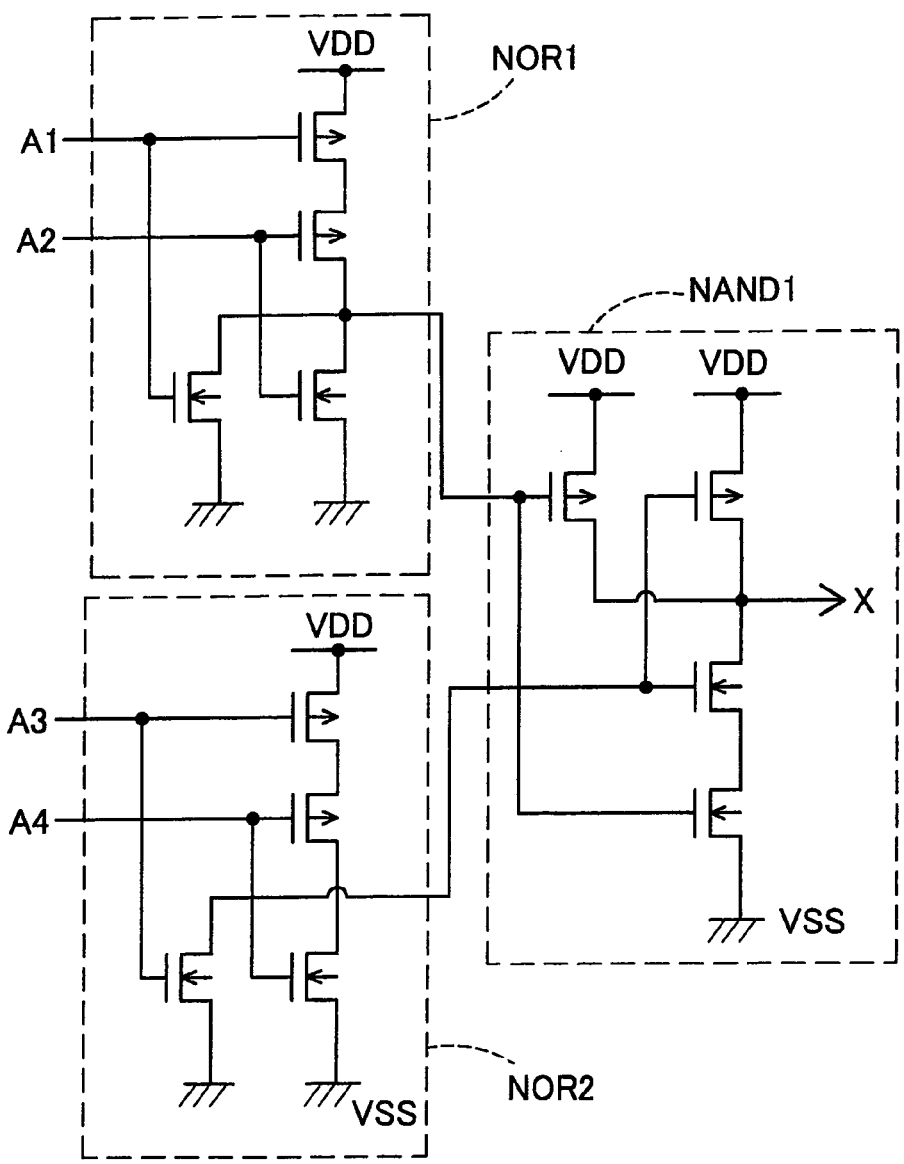
FIG. 3 is a schematic circuit diagram illustratively indicative of the functional circuit block shown in FIG. 2.
Figure 3:
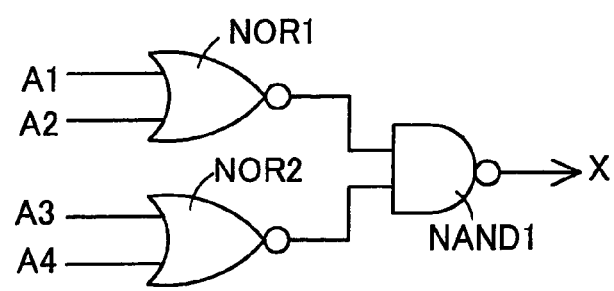

Now referring to FIG. 2, there is shown a layout diagram illustratively indicative of a layout example of a functional circuit block 20 formed by using fundamental cells 1A, 1B, 1C, and 1D in accordance with the present invention in a form of 2 by 2 matrix structure to implement the operating circuit shown in FIG. 3. The fundamental cells 1A, 1B, 1C, and 1D have no power rails VDD and VSS provided, so that when designing a layout implementing the metal wiring in the functional circuit block 20 by the connection of lowest metal wiring layer M1, no bridging over the power rails VDD and VSS will be necessary and the wiring may be connected as desired by only using the lowest metal wiring layer M1. More specifically, there is not present the power rails VDD and VSS formed by the lowest metal wiring layer M1 between the output from the fundamental cell 1C forming NOR1 and the output from the fundamental cell 1D forming NOR2 and predetermined gates of fundamental cells 1A and 1B forming NAND1 having those outputs as inputs, so that the metal wiring therebetween may be connected directly through the lowest metal wiring layer M1. In addition, the supply of ground potential VSS to the NMOS transistors in the fundamental cells 1A and 1B forming NAND1 as well as the supply of power source voltage VDD to the fundamental cells 1C and 1D forming respectively NOR1 and NOR2 may be achieved by connecting an upper metal wiring layer not shown in the figure to the connector terminals 3A and 2D both having a stack VIA structure.

The fundamental cell 1 in accordance with the present invention may implement the metal wiring in the fundamental cell 1 without being restricted by the power rails VDD and VSS, which wiring is to be placed between fundamental cells. Moreover, when forming the functional circuit block 20 with four fundamental cells 1A to 1D, since the power rails VDD and VSS are not fixed, the metal wiring in the functional circuit block 20 may be freely configured and changed as desired to avoid the mutual interference between the power rails VDD and VSS and signal wirings in a layout. More specifically, the metal wiring arrangement of bridging over the lowest metal wiring layer M1 by using the upper metal wiring layer M2 may be reduced to minimal requirement while at the same time the degree of freedom of metal wiring may be thereby ensured to maximum, allowing the metal wiring structure to become simpler and the wiring region in the upper metal wiring layer M2 to keep untouched as much as possible. The power rails VDD and VSS and the like may be designed as desired using the upper metal wiring layer M2 independent of the metal wiring layer in the fundamental cell 1, so that the prerequisite number of wiring tracks may be ensured while maintaining the lower cell height of the fundamental cell 1 than that compared with the structure using the same metal wiring layer for both wirings. Therefore, the present invention may provide a compact fundamental cell 1 having an efficient wiring structure to contribute to a higher degree of integration in a semiconductor integrated circuit device. The wiring direction, wiring width and wiring layer of the power rails may be freely designed as desired in correspondence with the operation specification of the circuitry in the functional circuit block 20, allowing an optimum circuit operation using the power rails VDD and VSS suitable to the requirement of operation specification of respective circuits.

Furthermore, the metal wiring layers forming the stacked VIA may also be used as the metal wiring layers for the power rails VDD and VSS. The wiring level in the metal wiring layers selectable for using as the power rails VDD and VSS may be appropriately selected from within the wiring layers forming the stacked VIA, resulting in a further higher degree of freedom of wiring.

Figure 4:
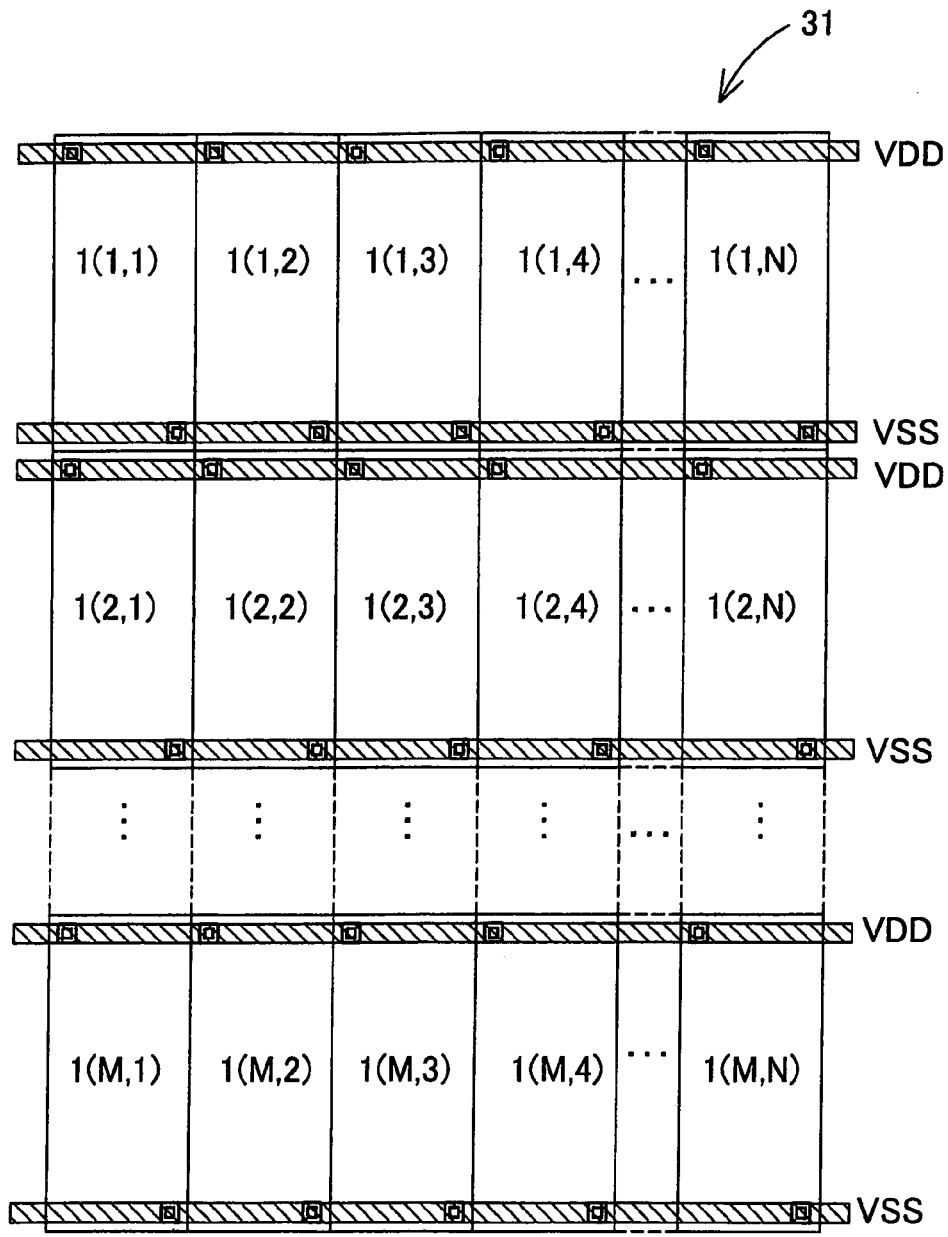
FIG. 4 is a layout diagram illustratively indicative of first practical embodiment of power rails when the fundamental cells in accordance with the present invention are arranged in a form of matrix.

Now referring to FIG. 4, there is shown a layout diagram illustratively indicative of first practical embodiment of power rails VDD and VSS in a functional circuit block 31 when the fundamental cells 1 (M, N) in accordance with the present invention are arranged in a form of N by M matrix, where M and N are integer more than 1. In this embodiment, if the metal wiring in the functional circuit block 31 are made using the lowest metal wiring layer M1, while the connection terminals 2 and 3 (see FIG. 1) in the fundamental cells 1 (M, N) are made as stacked VIAs to connect the power rails VDD and VSS formed by the upper metal wiring layer M2, then the metal wiring in the functional circuit block 31 and the power rails VDD and VSS may be arranged without mutual interference. Furthermore, it is quite practical also that those metal wiring placed in a direction parallel to the wiring direction of the power rails VDD and VSS, among the wirings in the functional circuit block 31, may be placed in the same metal wiring layer as the metal wiring layer used for the power rails VDD and VSS, while on the other hand the metal wiring in a direction perpendicular to the power rails VDD and VSS may be placed in a different metal wiring layer.

In accordance with first preferred embodiment of the present invention, wiring for supplying power source voltage and the ground potential to the fundamental cells 1 (M, N) may be freely designed such that the wiring direction, wiring width, and wiring layer of the power rails VDD and VSS may be set as desired in correspondence with the current consumed in the functional circuit block 31 in accordance with the circuit operation specification. Therefore, if the consumption current in the circuit operation is smaller and the power supply capability needs not to be reinforced because the circuitry operation in the functional circuit block 31 is relatively slower or another reason, the present invention may be preferably applied to the circuit in order to optimally place wiring of the power rails VDD and VSS. When the wiring direction of the power rails VDD and VSS is directed toward the row direction of the fundamental cells 1 (M, N) (directional lateral to the fundamental cells 1 (M,N)), wiring pitch can be enlarged to ensure larger area reserved for the distance between power rails VDD and VSS within the limited height of the fundamental cell 1, allowing using the same metal wiring layer as the power rails VDD and VSS for its maximum space. The present invention may therefore achieve an efficient wiring scheme and a smaller height of the fundamental cells 1 (M, N) as well as contribute to a higher integration of the semiconductor integrated circuit device.

Figure 5:
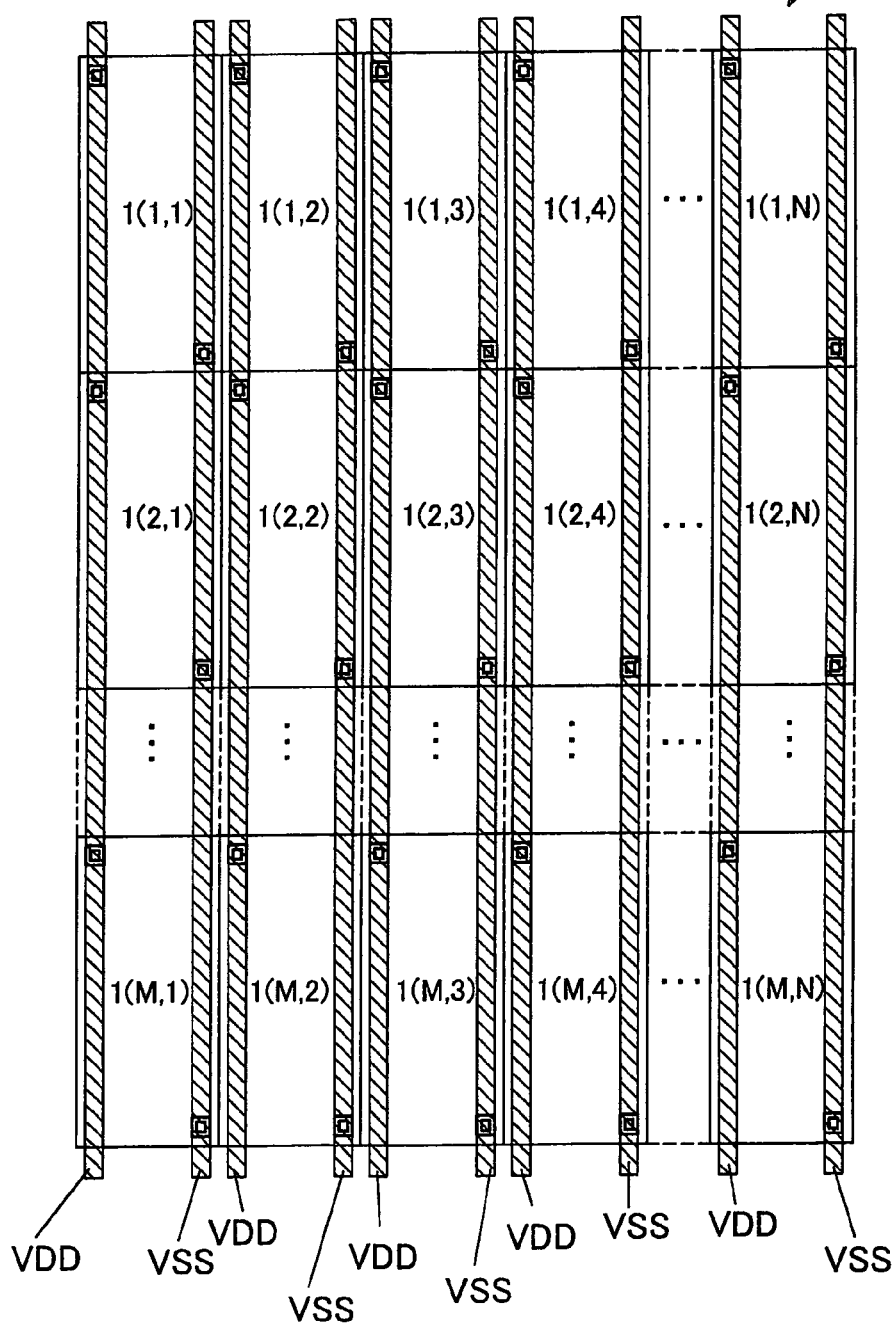
FIG. 5 is a layout diagram illustratively indicative of second practical embodiment of power rails when the fundamental cells in accordance with the present invention are arranged in a form of matrix.

Now referring to FIG. 5, there is shown a layout diagram illustratively indicative of second practical embodiment of power rails when the fundamental cells in accordance with the present invention are arranged in a form of matrix, where the wiring direction of the power rails VDD and VSS is rotated 90 degrees with respect to the fundamental cells 1 (M, N) similar to that shown in FIG. 4. The metal wiring in the functional circuit block 32 are formed by the lowest metal wiring layer M1 while the connection terminals 2 and 3 in the fundamental cells 1 (M, N) (see FIG. 1) are formed as stacked VIAs so as to connect to the power rails VDD and VSS formed in the upper metal wiring layer M2 so that the metal wiring in the functional circuit block 32 and the power rails VDD and VSS may be placed without mutual interference. It is also possible that those metal wiring placed in a direction parallel to the wiring direction of the power rails VDD and VSS, among the wiring in the functional circuit block 32, may be placed in the same metal wiring layer as the metal wiring layer used for the power rails VDD and VSS, while on the other hand the metal wiring in a direction perpendicular to the power rails VDD and VSS may be placed in a different metal wiring layer.

In accordance with the second preferred embodiment of the present invention, the wiring for supplying power source voltage and ground potential to the fundamental cells 1 (M, N) may be freely designed such that the wiring direction, wiring width, and wiring layer of the power rails VDD and VSS may be set as desired in correspondence with the current consumed in the functional circuit block 32 in accordance with the circuit operation specification. Therefore, if the consumption current in the circuit operation is larger and the power supply capability needs to be reinforced because the circuitry operation in the functional circuit block 32 is relatively faster or another reason, the present invention may be preferably applied to the circuit in order to optimally place the wiring of the power rails VDD and VSS. When the wiring direction of the power rails VDD and VSS is directed toward the column direction of the fundamental cells 1 (M, N) (direction longitudinal to the fundamental cells 1 (M,N)), wiring pitch can be narrowed to improve the power supply capability for each fundamental cells 1 (M, N).

In accordance with the first and second preferred embodiments of the present invention, in the fundamental cells 1 (M, N), the X and Y coordinates of the connection terminals 2 and 3 (see FIG. 1) to connect to the power rails VDD and VSS are set in different positions each other. The wiring direction of the power rails VDD and VSS to the functional circuit blocks 31 and 32 having fundamental cells 1 (M, N) arranged in a form of a matrix may be wired without crossing each other in the both X and Y directions.

The power rails VDD and VSS to the fundamental cells 1 (M, N) may be preferably freely configured to set arbitrarily the wiring direction, wiring width, and wiring layer of the power rails VDD and VSS in correspondence with the current consumed in the functional circuit blocks 31 and 32 in accordance with the circuit operation specification. This may allow the optimal circuit operation to be achieved due to the supply of power source voltage and ground potential appropriately set in accordance with the operation specification of respective circuit.

Figure 6:
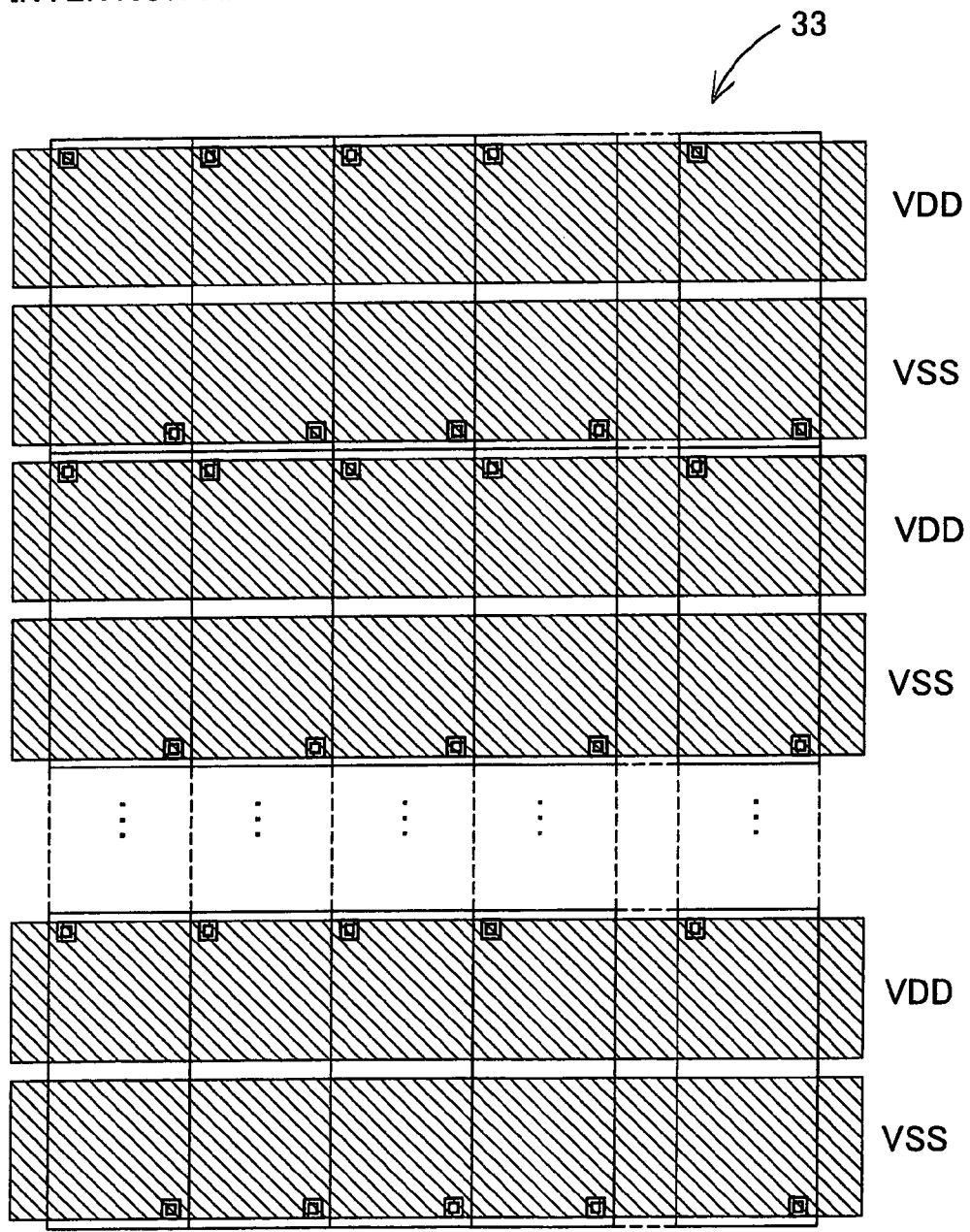
FIG. 6 is a layout diagram illustratively indicative of third practical embodiment of power rails when the fundamental cells in accordance with the present invention are arranged in a form of matrix.

Now referring to FIG. 6, there is shown a layout diagram illustratively indicative of third practical embodiment of power rails VDD and VSS when the fundamental cells in accordance with the present invention are arranged in a form of matrix, where the wiring width of the power rails VDD and VSS in the first preferred embodiment as shown in FIG. 4 is thickened to be reinforced. The metal wiring in the functional circuit block 33 are made with the lowest metal wiring layer M1 in a similar manner to the metal wiring in the functional circuit block 31 as shown in FIG. 4, and the connection terminals 2 and 3 (see FIG. 1) in the fundamental cells 1 (M, N) are made as stacked VIAs to connect the power rails VDD and VSS formed by the upper metal wiring layer M2. Since the metal wiring in the functional circuit block 33 and the power rails VDD and VSS may not be interfered each to other, the metal wiring width of the power rails VDD and VSS may be arbitrarily set to provide a power supply capability so as to conform to the current consumption stated in the circuit operation specification of the functional circuit block 33. As shown in FIG. 6, when the power rails VDD and VSS are placed so as to cover the functional circuit block 33, if the metal wiring layer for the power rails VDD and VSS is placed as the topmost metal wiring layer in order to ensure the space for the signal wiring area in the functional circuit block 33, then both metal wirings will be suitably isolated so as not to interfere. If the power rails VDD and VSS are configured with the upper metal wiring layer M2, the metal wiring in the functional circuit block 33 will be then made with the lowest metal wiring layer M1, however, if the metal wiring for the power rails VDD and VSS is placed in a metal wiring layer which is not shown in the figure but which is upper than M2, the wiring in the functional circuit block 33 may be drawn in any of multilayered metal wiring layers except for the topmost one.

Figure 7:
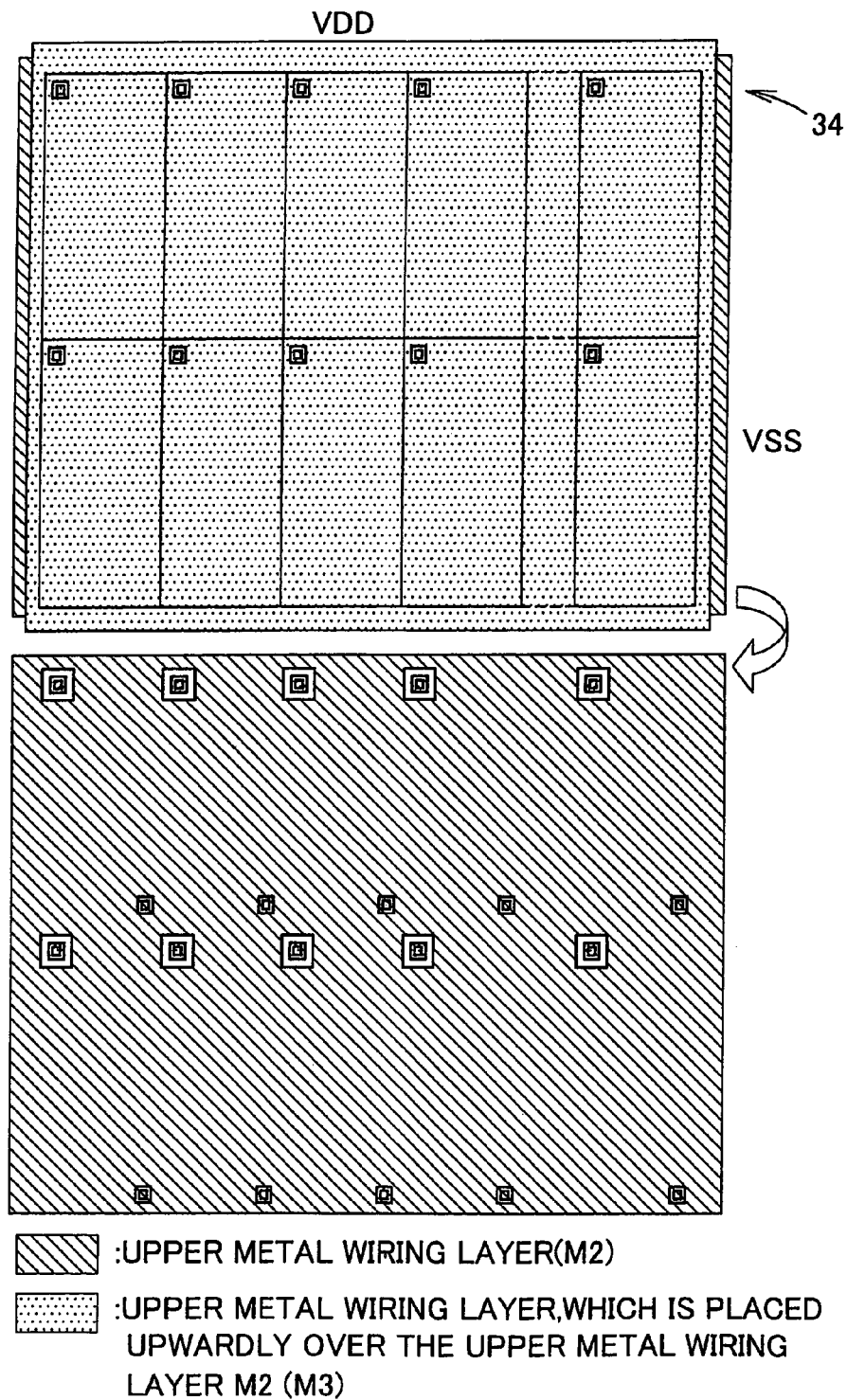
FIG. 7 is a layout diagram illustratively indicative of fourth practical embodiment of power rails when the fundamental cells in accordance with the present invention are arranged in a form of matrix.

Now referring to FIG. 7, there is shown a layout diagram illustratively indicative of third practical embodiment of power rails VDD and VSS when the fundamental cells in accordance with the present invention are arranged in a form of matrix, where the power rails VDD and VSS are formed as plane in respectively different metal wiring layer. The metal wiring in the functional circuit block 34 are formed by the lowest metal wiring layer M1 in a manner similar to the metal wiring in the functional circuit block 31 shown in FIG. 4, and the connection terminals 2 and 3 in the fundamental cells 1 (M, N) will be formed as stacked VIAS (see FIG. 1). For the supply of ground potential VSS in the power rails VDD and VSS, the upper metal wiring layer M2 will be used by forming as a plane to connect to the upper metal wiring layer M2 in the stacked VIA structure of the connector terminals 2. In this case, an opening is to be provided at the position of the connector terminal 3 in the upper metal wiring layer M2 formed as a plane such that the upper metal wiring layer M2 of the stacked VIAs that form the connector terminals 3 will not be contacted thereto. For the supply of power source voltage VDD in the power rails VDD and VSS, an upper metal wiring layer M3, which is placed upwardly over the upper metal wiring layer M2, will be formed as a plane to connect to the upper metal wiring layer M3 formed in the stacked VIAs structure for the connector terminals 3. The metal wiring in the functional circuit block 34 will not interfere with the power rails VDD and VSS and vice versa so that the metal wiring for the power rails VDD and VSS can be formed as a plane that may cover the entire surface of the functional circuit block 34, without being restricted by the signal wiring in the functional circuit block 34. If the levels of metal wiring layers used are more than four, then the metal wiring layer for the power rails VDD and VSS may be placed as the second topmost metal wiring layers to ensure more than two metal wiring layers to be served for signal wirings in the functional circuit block 34, thus suitably allowing improving the degree of freedom of signal wirings.

In accordance with the third and fourth preferred embodiments of the present invention, when the fundamental cells 1 (M, N) are formed so as to provide metal wirings without the geometrical restriction caused by the power rails VDD and VSS, and when the functional circuit blocks 33 and 34 are formed by arranging such fundamental cells 1 (M, N), since the power rails VDD and VSS are not fixed to a position, the metal wiring inside may be arbitrarily configured and changed as desired so as to prevent the interference between the power rails VDD and VSS and other signal wirings. Since the power rails VDD and VSS may be provided as a plane in the upper metal wiring layer M2 or upper metal wiring layer M3 independent of the lowest metal wiring layer M1 in the fundamental cells 1 (M, N), the cell height of the fundamental cells 1 (M, N) can be reduced when compared to the case in which both metal wirings are in the same level of metal wiring layer, and the wiring tracks required may be reserved, allowing providing a semiconductor integrated circuit device having a reduced fundamental cell height. In addition, in the fourth preferred embodiment, the power rails VDD and VSS may be formed as a plane covering the entire surface of the functional circuit block 34 beyond the height of the fundamental cells, the wiring plane for the power rails VDD and VSS may be formed in order to provide a preferable countermeasure for noises. In this situation, if there are used more than two systems of power rails VDD and VSS and the like, by providing a metal wiring layer for each system of power rails VDD and VSS, a wiring plane structure having multilayered planes will be formed.

Figure 8:
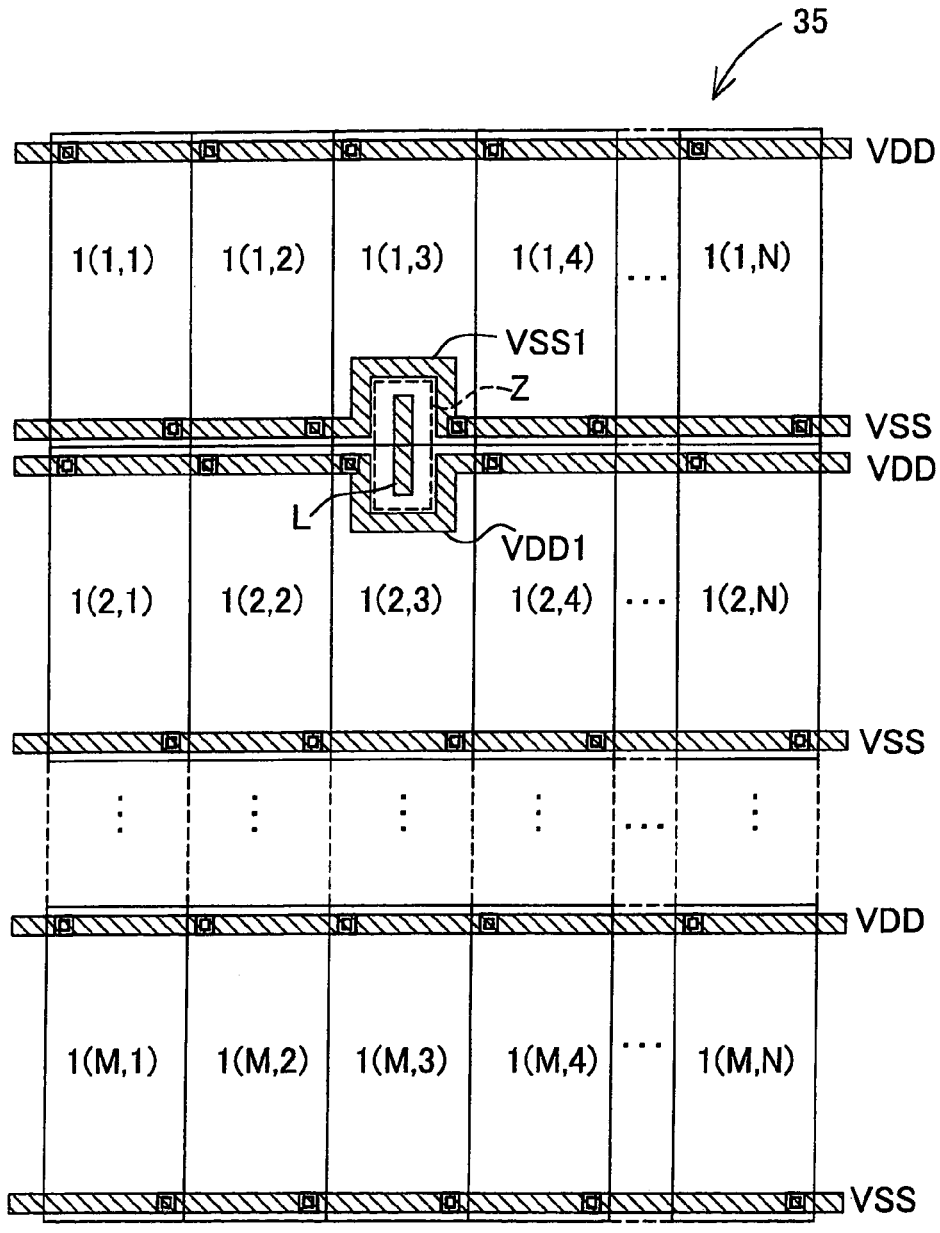
FIG. 8 is a layout diagram illustratively indicative of fifth practical embodiment of power rails when the fundamental cells in accordance with the present invention are arranged in a form of matrix.
Figure 8:

Now referring to FIG. 8, there is shown a layout diagram illustratively indicative of fifth practical embodiment of power rails VDD and VSS when the fundamental cells 1 (M, N) of the functional circuit block 35 in accordance with the present invention are arranged in a form of M by N matrix, in a manner similar to the first preferred embodiment shown in FIG. 4. The difference from the first preferred embodiment shown in FIG. 4 is such that the metal wiring L connecting a fundamental cell 1 (1, 3) to another fundamental cell 1 (2, 3) is formed in the upper metal wiring layer M2 used for the wiring of power rails VDD and VSS. In this example, in order to avoid the interference between the metal wiring L and the power rails VDD and VSS, a design rule is applied to take into consideration the metal wiring L and the distance between metal wirings needed in the layout. As a result, a wiring prohibited area Z of the power rails VDD and VSS will be placed. In theory, the metal wiring L that is perpendicular to the power rails VDD and VSS are to be placed in the lowest metal wiring layer M1 as a rule, in which layer the metal wiring L will not interfere with the wiring of power rails VDD and VSS. However, there are wirings of lowest metal wiring layer M1 between the metal wirings L and the metal wiring L needs to be formed in the upper metal wiring layer M2 to bridge over the lowest metal wiring layer M1. In the fifth preferred embodiment, it can be appreciated clearly that, by making use the fact that the power rails VDD and VSS are not placed in fundamental cells 1 (M, N), if the metal wiring L may not be formed in the lowest metal wiring layer M1 in the context of metal wirings when the functional circuit block 35 will be formed, the metal wiring L may alternatively be formed in the upper metal wiring layer M2. In this situation, the power rails VDD and VSS may be wired by bypassing the wiring prohibited area Z in the functional circuit block 35. Since the bypass routing is limited within the functional circuit block 35, the power rails VDD and VSS will not interfere with the wiring tracks at the edge of functional circuit block 35, thus the connecting status with respect to adjacent functional circuit blocks may be retained, as well as the wiring required between the fundamental cells may be flexibly routed with the least minimum detour path.

In accordance with the fifth preferred embodiment, a wiring prohibited area Z may be individually placed on the wiring route of power rails VDD and VSS. In this manner, the power rails VDD and VSS may be appropriately routed flexibly around the wiring prohibited area Z, so that the power rails VDD and VSS may be routed as desired. The mutual interference between the power rails VDD and VSS and the wiring prohibited area Z may also be avoided. Since the wiring track of power rails VDD and VSS except of a wiring prohibited area Z is invariable, the connecting status with respect to adjacent functional circuit blocks in a semiconductor integrated circuit device may be restored. A wiring prohibited area Z may be bypassed with the least minimum routing of the power rails VDD and VSS to place a flexible design of metal wirings.

Figure 9:
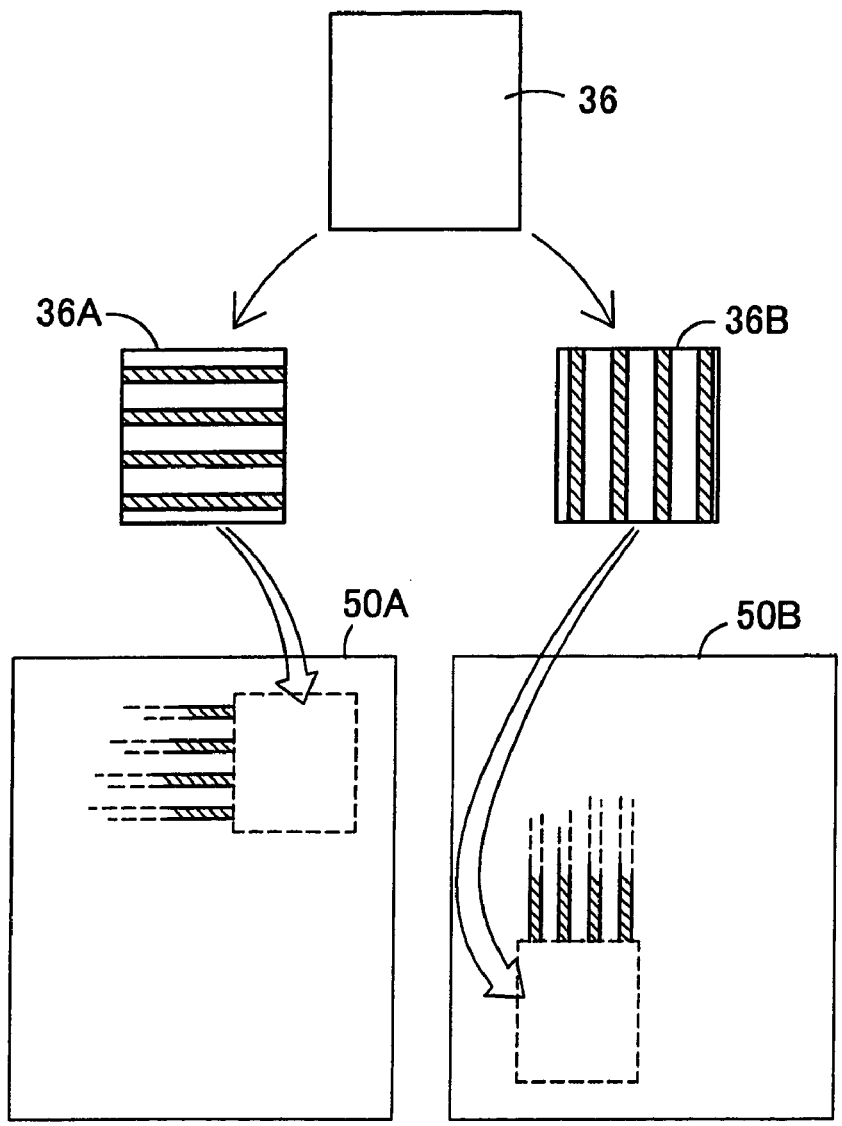
FIG. 9 is a layout diagram illustratively indicative of sixth practical embodiment of power rails when the functional circuit blocks in accordance with the present invention are arranged to form a semiconductor integrated circuit device.

Now referring to FIG. 9, there is shown a layout diagram illustratively indicative of sixth practical embodiment of power rails when the functional circuit blocks in accordance with the present invention are arranged to form a semiconductor integrated circuit device, in which the functional circuit block 36 is used as a macro cell to implement in the semiconductor integrated circuit device 50A and 50B of the gate array type or standard cell type. The wiring direction of the power rails VDD and VSS in the semiconductor integrated circuit device 50A and 50B may be, in general, individually differed from each other according to the layout or the design rule applied to the semiconductor integrated circuit device 50A and 50B. In addition, the wiring direction of the power rails VDD and VSS may also be varied according to the position of the functional circuit block 36 used. In the sixth preferred embodiment, the wiring direction of the power rails VDD and VSS at the position of the functional circuit block 36 is in the direction of X axis (laterally) in case of the semiconductor integrated circuit device 50A, while on the other hand Y axis (vertically) in case of the semiconductor integrated circuit device 50B. Therefore, if the functional circuit block 36 is configured with fundamental cells 1 having no power rails VDD and VSS provided, the wiring direction of the power rails VDD and VSS of the functional circuit block 36 may be readily changed in accordance with the wiring condition of the power rails VDD and VSS in both semiconductor integrated circuit device 50A and 50B at the time of placing a functional circuit block 36 in the semiconductor integrated circuit device 50A and 50B, resulting in an easy and positive placement of the functional circuit block 36. Furthermore, if there are the functional circuit blocks 36 with the functional inspection completed in an macro cell library or IP (intellectual property), the wiring direction of the power rails VDD and VSS in the functional circuit block 36 may be appropriately changed in correspondence with the wiring status of the power rails VDD and VSS in the semiconductor integrated circuit device 50A and 50B by forming the power rails VDD and VSS with the upper layer metal wiring that will not be affected by the signal wirings in the functional circuit block 36.

In accordance with the sixth preferred embodiment of the present invention, in the semiconductor integrated circuit device 50A and 50B of the gate array type or standard cell type, to which functional circuit blocks 36 are to be incorporated, the wiring direction, wiring width, and wiring layer of the power rails VDD and VSS may be appropriately and freely configured conforming to the position between the functional circuit blocks 36A and 36B. Therefore, the functional circuit blocks 36A and 36B may be positioned in an efficient way to improve the integration of the semiconductor integrated circuit device 50A and 50B.

Figure 10:
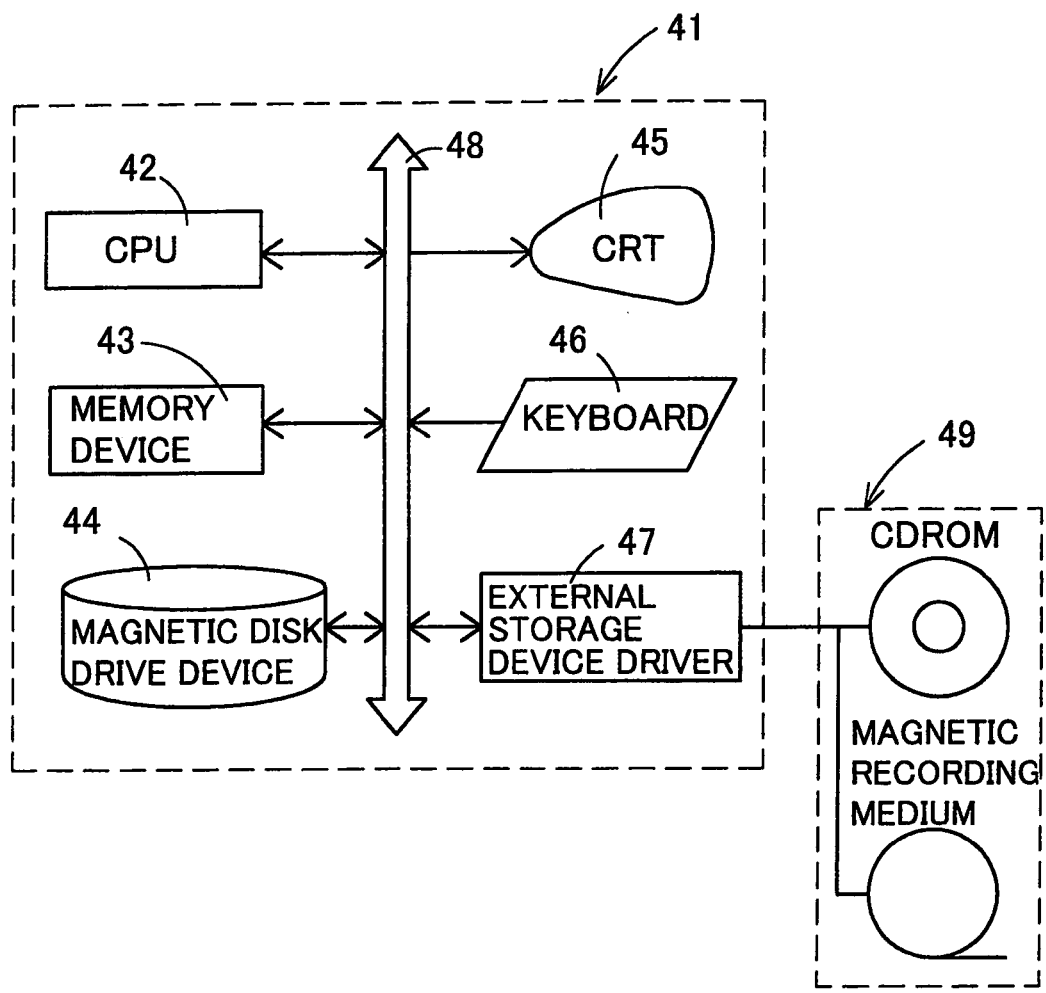
FIG. 10 is a schematic block diagram illustratively indicative of a wiring apparatus in accordance with the present invention.

The wiring apparatus 41 shown in FIG. 10 includes a processor (CPU) 42, which is interconnected through a bus 48, a memory device 43, a magnetic disk drive device 44, a display device (CRT) 45, a keyboard 46, and an external storage device driver 47. The external storage device driver 47 may incorporate a removable recording medium 49 including such as a CDROM and a magnetic disk.

As will be discussed later with reference to FIG. 11, a program that executes the flow of wiring method to the functional circuit blocks using the fundamental cells 1 of the present invention may be stored in either the memory 43 or the magnetic disk drive 44 in the wiring apparatus 41. Alternatively, if the program is stored on an external recording medium 49 such as a CDROM and a magnetic recording medium, the program will be loaded into the memory 43 or the magnetic disk drive 44 through the external storage device driver 47 or will be transferred directly to the CPU 42. At this point, the wiring information including the wiring direction, wiring width, wiring priority, wiring layer of the power rails VDD and VSS, and the wiring prohibited area Z in the wiring routes may be configured by a wiring information configuration unit including the keyboard 46, or the removable recording medium 49 such as the CDROM and magnetic recording medium. Thus configured wiring information may be stored in the wiring information storage unit including the memory 43 and the magnetic disk drive 44. The wiring information storage unit such as the memory 43 and the magnetic disk drive 44 may store the positions of connector terminals of the fundamental cells 1. In accordance with the process steps of the program, the commands issued from the controller unit including the CPU 42 will refer the information as needed to perform the wiring process. The progress of the wiring process may be monitored by a monitoring unit including the CRT 45. The resulting wiring may be stored in a wiring data storage unit including the memory 43, magnetic disk drive 44, or the removable recording medium 49 including the CDROM and magnetic recording medium through the external storage device driver 47.

Figure 11:
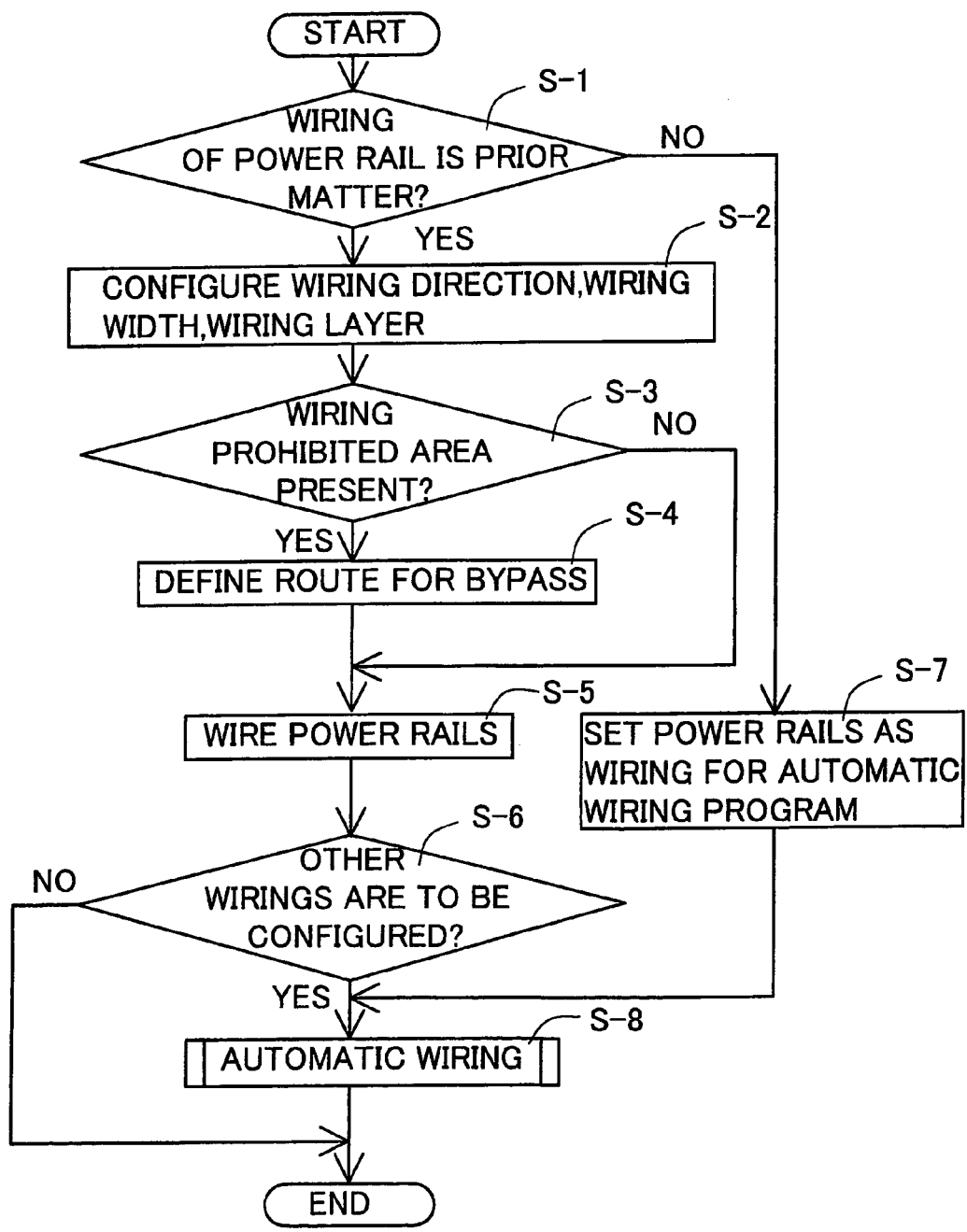
FIG. 11 is a flow chart of a wiring method for wiring in a functional circuit block using the fundamental cells in accordance with the present invention.

The flow diagram shown in FIG. 11 indicates a wiring method when implementing metal wirings on the functional circuit blocks using the fundamental cells 1 in accordance with the present invention. In step 1 (S-1), if the wiring of the power rails VDD and VSS is a priority matter input from the keyboard, magnetic disk drive 44, or removable recording medium 49, then (S-1: Yes). Then, the wiring direction, wiring width, and the metal wiring layer to be used for the power rails will be configured (S-2). Next, it will be determined whether there is present a wiring prohibited area in the functional circuit block (S-3). If yes (S-3: Yes), then a route bypassing that wiring prohibited area will be defined (S-4). After a bypass route is defined or if there is not a wiring prohibited area (S-3: No), the power rails VDD and VSS will be wired (S-5). After wiring, if the metal wirings such as signal lines other than the power rails VDD and VSS are to be configured (S-6: Yes), then the control will be passed to the automatic wiring program routine to execute the automatic wiring (S-8). When the automatic wiring is completed, or when there is no further wiring required for any other signal lines, (S-6: No), then the wiring process terminates. On the other hand, in step 1, if the power rails VDD and VSS is not set as a priority matter (S-1: No), then the power rails VDD and VSS will be configured as metal wirings to be designed like other signal lines in the automatic wiring program (S-7), the control will be passed to the automatic wiring program routine to execute the automatic wiring (S-8). The completion of automatic wiring will terminate the wiring program. The automatic wiring as shown by step 8 may be performed by any known automatic wiring program.

In accordance with the wiring apparatus 41 and the wiring method of the present invention, in the fundamental cell 1 which allows metal wirings to be designed as desired without being limited by the power rails VDD and VSS and in the functional circuit block having such fundamental cell 1 arranged because the power rails VDD and VSS is not fixed in the fundamental cell 1, a wiring method which allows any wirings to be configured and changed as desired without interference may be executed on the wiring apparatus shown in FIG. 10. The wiring direction, wiring width, and wiring layer of the power rails VDD and VSS may be arbitrarily set in accordance with the placement among functional circuit blocks, allowing achieving an efficient arrangement of functional circuit blocks, and improving the integration of semiconductor integrated circuit device. The wiring method used in the semiconductor integrated circuit device of the gate array type and standard cell type in which device the fundamental cells 1 may be arranged in a functional circuit block of the form of a matrix, wherein the wiring direction, wiring width, and wiring layer of the power rails VDD and VSS may be arbitrarily configured conforming to the arrangement of functional circuit blocks, may be performed on the wiring apparatus shown in FIG. 10. In this situation, the wiring of the power rails VDD and VSS may be configured and stored together with the fundamental cell information including the positions of the connection terminals 2 and 3 to perform the design of wiring layout, while at the same time the wiring will be monitored during the process.

It is to be understood that the present invention is not to be limited to the details herein given but may be modified or embodied in other specific forms without departing from the spirit or essential characteristics thereof.

For instance, in the first through third embodiments of the present invention, an example has been described in which the power source line VDD and ground potential line VSS in the functional circuit block are placed in the lowermost metal wiring layer M1, and power rails VDD and VSS are placed in the upper metal wiring layer M2. The present invention is not limited thereto however. It is clearly appreciated from the foregoing description that another embodiment in which the power source line VDD and ground potential line VSS in the functional circuit block are placed in the upper metal wiring layer may be easily devised by one skilled in the art. The power rails VDD and VSS may alternatively formed in an upper layer of metal wirings over the upper metal wiring layer M2. If in this case the connection terminals 2 and 3 are made as stacked VIAs, then these terminals may be connected to any other metal wiring layers.

In the fifth preferred embodiment of the present invention, as have been described above, although a typical example has been described in which the power rails VDD and VSS is routed to the upper metal wiring layer M2 for bypassing around a wiring prohibited zone Z, the present invention is not limited thereto. Rather, the bypass route may be formed in a similar manner in any of other metal wiring layers of power rails VDD and VSS if it is a metal wiring layer forming the power rails VDD and VSS.

In the flow chart illustratively indicative of the wiring method in accordance with the present invention, a flow has been described which appropriately branches the process flow in either the case in which the metal wiring of the power rails VDD and VSS is to be designed as a priority matter of layout, the case in which the power rails VDD and VSS is at the same priority as other signal lines to be executed in the automatic wiring process, the case in which wiring prohibited area is bypassed when the metal wiring of power rails VDD and VSS is to be drawn first, or the case in which the metal wiring of the power rails VDD and VSS will be wired while other signal lines will not be processed. However, the present invention is not limited thereto. Each process step in the process flow in accordance with the wiring method of the present invention may be individually and independently performed, or in any combination.

Although in the preferred embodiments metal wiring has been cited as examples, the present invention is not limited thereto, and may be equally applied to the wiring using any other wiring materials including such as polysilicon or silicide and the like, or to the wiring using any combination of metal wiring material and any other materials including polysilicon and silicide.

In accordance with the present invention, a fundamental cell, semiconductor integrated circuit device, wiring method, and wiring apparatus may be provided, in which no fixed wiring is predefined in the fundamental cell and the connector terminals for connecting to wirings between fundamental cells are defined, so that the degree of freedom of wiring to be drawn between fundamental cells at the time of designing the layout of a functional circuit block or a semiconductor integrated circuit device by arranging more than two fundamental cells.

The foregoing description of the preferred embodiment of the invention has been presented for purposes of illustration and description. It is not intended to be exhaustive or to limit the invention to the precise form disclosed, and modifications and variations are possible in light of the above teachings or may be acquired from practice of the invention. The embodiment chosen and described in order to explain the principles of the invention and its practical application to enable one skilled in the art to utilize the invention in various embodiments and with various modifications as are suited to the particular use contemplated. It is intended that the scope of the invention be defined by the claims appended hereto, and their equivalent.

What is claimed is:

1. A wiring method in the layout design of a semiconductor integrated circuit device including a plurality of fundamental cells, comprising the steps of:
   providing no fixed wiring for interconnection between the fundamental cells;
   providing with a connecting terminal to be connected to an upper wiring constituted by an upper wiring layer in the fundamental cell;
   selecting a predetermined wiring direction and a predetermined wiring width of the upper wiring to be connected between the connecting terminals for interconnection between the fundamental cells; and
   wiring the upper wirings to be connected between the connecting terminals by wiring priority.

2. A wiring method according to claim 1, wherein:
   the wiring widths of the upper wirings are defined in a form of a plane exceeding the fundamental cells.

3. A wiring method according to claim 1, wherein:
   the upper wirings are defined in wiring layers of different levels with respect to other signal lines or upper wirings over the other lines.

4. A wiring method according to claim 1, wherein:
   when there is present a wiring prohibited area on the wiring path of the upper wiring, the wiring prohibited area will be bypassed by routing appropriately the wiring path of the upper wiring.

5. A wiring method in the layout design of a semiconductor integrated circuit device including a plurality of fundamental cells, comprising:
   providing no fixed wiring for interconnection between the plurality of fundamental cells in the fundamental cell included in the plurality of fundamental cells;
   providing a connecting terminal to be connected to an upper wiring constituted by an upper wiring layer in a fundamental cell included in the plurality of fundamental cells; and
   wiring upper wirings to be connected between connecting terminals together with other wirings and to be over the fundamental cell by performing a wiring process.

6. A wiring apparatus for performing the wiring method according to claim 1, comprising:
   a cell information storage unit for storing fundamental cell information including the positions of the connecting terminals;
   a wiring information configuration unit for configuring as needed wiring information with respect to the wiring directions, wiring widths, wiring priority, wiring layers of upper wirings to be connected with corresponding connecting terminals between the fundamental cells, as well as information with respect to wiring prohibited area in the wiring path;
   a wiring information storage unit for storing wiring information configured by the wiring information configuration unit;
   a controller unit for performing the wiring process in accordance with the information on the wiring directions, wiring widths, wiring priority, and wiring layers of the upper layer wirings stored in the wiring information storage unit and based on the position information of the connecting terminals stored in the cell information storage unit for bypassing the wiring prohibited area in the wiring path;
   a wiring monitoring unit for monitoring the progress of wiring process performed by the controller unit; and
   a wiring data storage unit for storing the resulting wiring process performed by the controller unit.

7. The wiring apparatus according to claim 6, wherein the controller unit performs a wiring method comprising:
   providing no fixed wiring for interconnection between the fundamental cells;
   providing a connecting terminal to be connected to an upper wiring constituted by an upper wiring layer in the fundamental cell;
   selecting a predetermined wiring direction and a predetermined wiring width of the upper wiring to be connected between the connecting terminals for interconnection between the fundamental cells; and
   wiring the upper wirings to be connected between the connecting terminals by wiring priority.

8. A wiring apparatus for performing the wiring method according to claim 5, comprising:
   a cell information storage unit for storing fundamental cell information including the positions of the connecting terminals;

a wiring information configuration unit for configuring as needed wiring information with respect to the wiring directions, wiring widths, wiring priority, wiring layers of the upper wirings to be connected with the corresponding connecting terminals between the fundamental cells, as well as information with respect to wiring prohibited area in the wiring path;

a wiring information storage unit for storing wiring information configured by the wiring information configuration unit;

a controller unit for performing the wiring process in accordance with the information on the wiring directions, wiring widths, wiring priority, and wiring layers of the upper layer wirings stored in the wiring information storage unit and based on the position information of the connecting terminals stored in the cell information storage unit for bypassing the wiring prohibited area in the wiring path;

a wiring monitoring unit for monitoring the progress of wiring process performed by the controller unit; and a wiring data storage unit for storing the result of wiring process performed by the controller unit.

9. The wiring apparatus according to claim 8, wherein the controller unit performs a wiring method comprising:

providing no fixed wiring for interconnection between the plurality of fundamental cells;

providing a connecting terminal to be connected to an upper wiring constituted by an upper wiring layer in a fundamental cell included in the plurality of fundamental cells; and wiring the upper wirings to be connected between the connecting terminal together with other wirings and to be over the fundamental cell by performing a wiring process.

* * * * *